(12) United States Patent
Li et al.

(10) Patent No.: US 11,287,394 B1
(45) Date of Patent: Mar. 29, 2022

(54) DETECTION SYSTEM AND METHOD FOR DISTRIBUTION STATE OF MAGNETIC FLUID IN SEALING GAP

(71) Applicant: Tsinghua University, Beijing (CN)

(72) Inventors: Decai Li, Beijing (CN); Nuo Chen, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 0 days.

(21) Appl. No.: 17/497,240

(22) Filed: Oct. 8, 2021

(30) Foreign Application Priority Data

Oct. 29, 2020 (CN) .......................... 202011183722.7

(51) Int. Cl.
G01N 27/22 (2006.01)
G01R 29/08 (2006.01)
G01R 27/26 (2006.01)
G01R 27/22 (2006.01)

(52) U.S. Cl.
CPC ........... *G01N 27/221* (2013.01); *G01N 27/22* (2013.01); *G01R 27/22* (2013.01); *G01R 27/2605* (2013.01); *G01R 29/0807* (2013.01)

(58) Field of Classification Search
CPC .. G01N 27/221; G01R 27/22; G01R 27/2605; G01R 29/12
See application file for complete search history.

(56) References Cited

FOREIGN PATENT DOCUMENTS

| CN | 1546890 | 11/2004 |
|---|---|---|
| CN | 101008422 | 8/2007 |
| CN | 101493184 A | * 7/2009 |
| CN | 101749432 | 6/2010 |
| CN | 103148976 | 6/2013 |
| CN | 103442744 | 12/2013 |
| CN | 203848903 | 9/2014 |
| CN | 204828678 | 12/2015 |
| CN | 109061324 | 12/2018 |
| CN | 106546517 B | * 3/2019 |
| CN | 109595344 | 4/2019 |
| CN | 109633493 | 4/2019 |

OTHER PUBLICATIONS

CNIPA, Notification to Grant Patent Right for Invention for CN Application No. 202011183722.7, dated May 31, 2021.

* cited by examiner

*Primary Examiner* — Amy He
(74) *Attorney, Agent, or Firm* — Hodgson Russ LLP

(57) ABSTRACT

The present disclosure provides a detection system and method for a distribution state of magnetic fluid in a sealing gap. The detection system includes: a detection assembly including a first capacitor plate, a second capacitor plate and a capacitance meter. The first capacitor plate is arranged at an inner circumferential surface of a pole piece in a sealing device, and the second capacitor plate is arranged at an outer circumferential surface of a rotating shaft in the sealing device. The first capacitor plate and the second capacitor plate are annular and opposite to each other in a radial direction of the rotating shaft, the sealing gap being formed between the first capacitor plate and the second capacitor plate. The capacitance meter is electrically connected with the first capacitor plate and the second capacitor plate to measure capacitance between the first capacitor plate and the second capacitor plate.

11 Claims, 1 Drawing Sheet

OUTER    INNER    OUTER

US 11,287,394 B1

DETECTION SYSTEM AND METHOD FOR DISTRIBUTION STATE OF MAGNETIC FLUID IN SEALING GAP

CROSS-REFERENCE TO RELATED APPLICATION

This application is based on and claims priority to Chinese Application No. 202011183722.7, filed on Oct. 29, 2020, the entire content of which is incorporated herein by reference for all purposes.

FIELD

The present disclosure relates to the field of magnetic fluid seal technologies, and particularly to a detection system and method for a distribution state of magnetic fluid in a sealing gap.

BACKGROUND

Magnetic fluid is widely applied in an engineering field, and a rotary seal is one of numerous applications of the magnetic fluid. Compared with a conventional sealing technology, the magnetic-fluid rotary seal has advantages of zero leakage, a high reliability, low abrasion, a long service life, or the like.

In a related art, an effective detection method is lacked for a distribution state of the magnetic fluid in a sealing part under different working states, a sealing condition of the magnetic fluid is unable to be observed under the working state, and a dangerous condition is unable to be avoided.

SUMMARY

The present disclosure seeks to solve at least one of the problems in the related art to some extent.

To this end, an embodiment of an aspect of the present disclosure provides a detection system for a distribution state of magnetic fluid in a sealing gap, which may detect the distribution state of the magnetic fluid in a sealing device in any working state, so as to learn a sealing condition of the magnetic fluid and avoid a dangerous condition.

An embodiment of another aspect of the present disclosure provides a detection method for a distribution state of magnetic fluid in a sealing gap.

In a detection system for a distribution state of magnetic fluid in a sealing gap according to an embodiment of a first aspect of the present disclosure, the sealing gap is formed in a sealing device, the sealing device includes a rotating shaft and a pole piece fitted over the rotating shaft, and a gap exists between an inner circumferential surface of the pole piece and an outer circumferential surface of the rotating shaft in a radial direction of the rotating shaft. The detection system includes a detection assembly. The detection assembly includes: a first capacitor plate configured to be annular and arranged at the inner circumferential surface of the pole piece; a second capacitor plate configured to be annular and arranged at the outer circumferential surface of the rotating shaft and opposite to the first capacitor plate in the radial direction of the rotating shaft, the sealing gap being formed between the first capacitor plate and the second capacitor plate; and a capacitance meter electrically connected to both the first capacitor plate and the second capacitor plate being annular and configured to measure capacitance between the first capacitor plate and the second capacitor plate.

A detection method for a distribution state of magnetic fluid in a sealing gap according to an embodiment of a second aspect of the present disclosure utilizes a detection system to detect the distribution state of the magnetic fluid in the sealing gap. The sealing gap is formed in a sealing device, the sealing device includes a rotating shaft and a pole piece fitted over the rotating shaft, and a gap exists between an inner circumferential surface of the pole piece and an outer circumferential surface of the rotating shaft in a radial direction of the rotating shaft. The detection system includes a detection assembly. The detection assembly includes: a first capacitor plate configured to be annular and arranged at the inner circumferential surface of the pole piece; a second capacitor plate configured to be annular and arranged at the outer circumferential surface of the rotating shaft and opposite to the first capacitor plate in the radial direction of the rotating shaft, the sealing gap being formed between the first capacitor plate and the second capacitor plate; and a capacitance meter electrically connected to both the first capacitor plate and the second capacitor plate being annular and configured to measure capacitance between the first capacitor plate and the second capacitor plate. The detection method includes: starting the rotating shaft, and driving, by the rotating shaft, the second capacitor plate to rotate; starting the capacitance meter, and recording the capacitance between the first capacitor plate and the second capacitor plate as sealing capacitance; and determining a sealing state of the magnetic fluid in the sealing gap according to the sealing capacitance.

Figure 1:
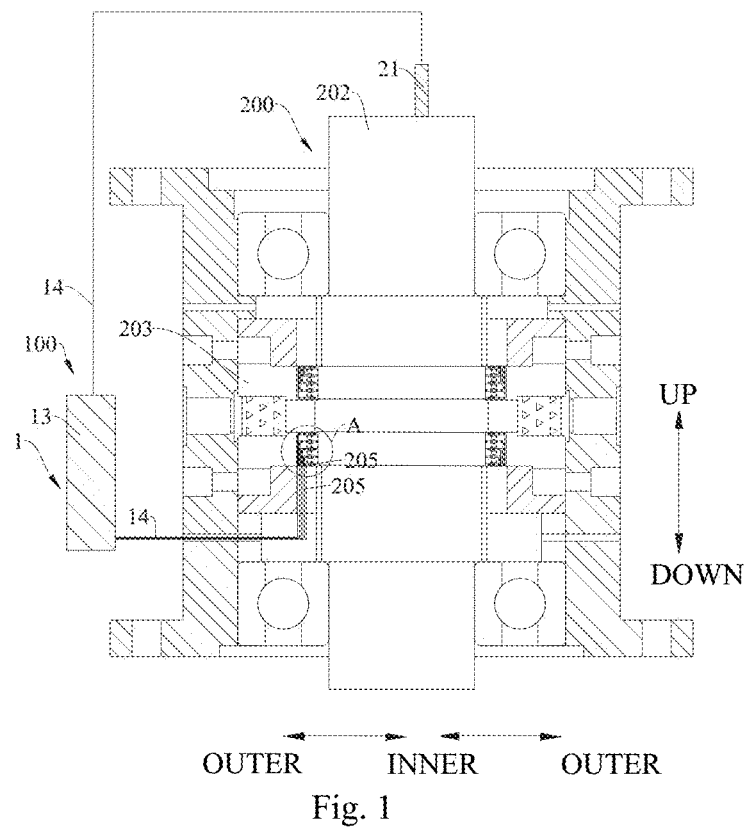
FIG. 1 is a schematic diagram of a detection system for a distribution state of magnetic fluid in a sealing gap according to an embodiment of the present disclosure.

REFERENCE NUMERALS detection system 100; detection assembly 1; first capacitor plate 11; second capacitor plate 12; capacitance meter 13; electric wire 14; power source 2; brush device 21;

sealing device 200; sealing gap 201; rotating shaft 202; first annular groove 2021; pole piece 203; pole piece hole 2031; shaft sleeve 204; second annular groove 2041; conduit 205; annular pole tooth 206.

DETAILED DESCRIPTION

Reference will be made in detail to embodiments of the present disclosure, and the examples of the embodiments are illustrated in the drawings. The embodiments described herein with reference to drawings are illustrative, and intended for explaining the present disclosure. The embodiments shall not be construed to limit the present disclosure.

Figure 2:
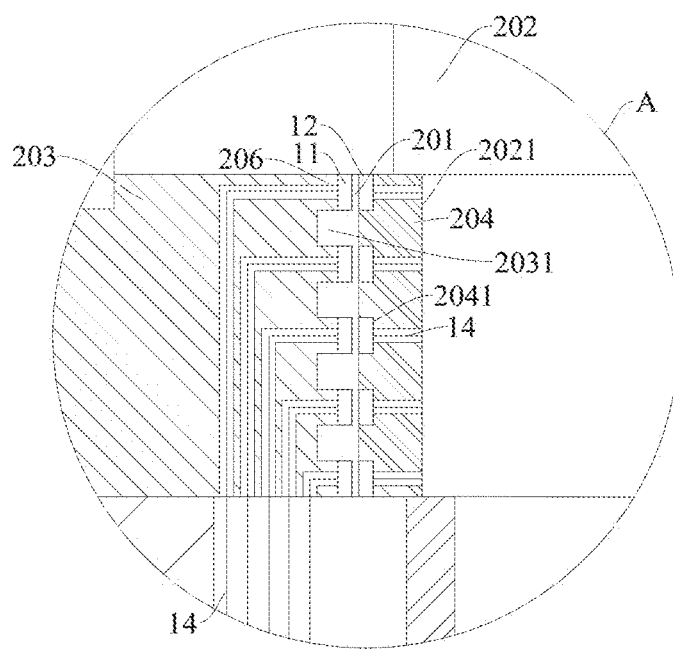
FIG. 2 is a schematic partially enlarged diagram at A in FIG. 1.

As shown in FIGS. 1 to 2, a detection system 100 for a distribution state of magnetic fluid in a sealing gap according to an embodiment of the present disclosure includes a detection assembly 1.

The sealing gap 201 is formed in a sealing device 200 including a rotating shaft 202 and a pole piece 203. The pole piece 203 is fitted over the rotating shaft 202, and a gap exists between an inner circumferential surface of the pole piece 203 and an outer circumferential surface of the rotating shaft 202 in a radial direction (the inside-outside direction shown in FIG. 1) of the rotating shaft 202. As shown in FIG. 1, a cross section of the pole piece 203 has an annular outer circumferential profile, a pole piece hole 2031 is formed in the pole piece 203, the rotating shaft 202 is inserted into the pole piece hole 2031, the gap exists between the inner circumferential surface of the pole piece 203 and the outer circumferential surface of the rotating shaft 202 in the inside-outside direction, an axial direction of the rotating shaft 202 is the up-down direction shown in FIG. 1, and the rotating shaft 202 may freely rotate around the axial direction thereof.

The detection assembly 1 includes a first capacitor plate 11, a second capacitor plate 12 and a capacitance meter 13, both the first capacitor plate 11 and the second capacitor plate 12 are annular, the first capacitor plate 11 is provided at the inner circumferential surface of the pole piece 203, the second capacitor plate 12 is provided at the outer circumferential surface of the rotating shaft 202, the first capacitor plate 11 and the second capacitor plate 12 are opposite to each other in the radial direction of the rotating shaft 202, and the sealing gap 201 is formed between the first capacitor plate 11 and the second capacitor plate 12.

As shown in FIG. 1, the first capacitor plate 11 and the second capacitor plate 12 are both annular, and arranged opposite to each other in the inside-outside direction. Specifically, an upper end of the first capacitor plate 11 has a same height as an upper end of the second capacitor plate 12 in the up-down direction, and a lower end of the first capacitor plate 11 has a same height as a lower end of the second capacitor plate 12 in the up-down direction.

The sealing gap 201 is formed between the first capacitor plate 11 and the second capacitor plate 12, and the rotating shaft 202 may drive the second capacitor plate 12 to rotate. When the second capacitor plate 12 rotates, the first capacitor plate 11 and the second capacitor plate 12 have an unchanged relative area.

The first capacitor plate 11 and the second capacitor plate 12 are both electrically connected with the capacitance meter 13, and the capacitance meter 13 is configured to measure capacitance between the first capacitor plate 11 and the second capacitor plate 12. As shown in FIGS. 1 and 2, a conduit 205 is provided in the sealing device 200, the detection assembly 1 further includes at least two electric wires 14 provided in the conduit 205, the first capacitor plate 11 is in communication with the capacitance meter 13 by one electric wire 14, the second capacitor plate 12 is in communication with the capacitance meter 13 by the other electric wire 14, and the capacitance meter 13 is configured to measure the capacitance between the first capacitor plate 11 and the second capacitor plate 12.

In the detection system 100 for a distribution state of magnetic fluid in a sealing gap according to the embodiment of the present disclosure, the first capacitor plate 11 is provided at the inner circumferential surface of the pole piece 203 in the sealing device, the second capacitor plate 12 is provided at the outer circumferential surface of the rotating shaft 202 in the sealing device, both the first capacitor plate 11 and the second capacitor plate 12 are annular, and the first capacitor plate 11 and the second capacitor plate 12 are opposite to each other in the radial direction of the rotating shaft 202, thus guaranteeing the unchanged relative area between the first capacitor plate 11 and the second capacitor plate 12 when the rotating shaft 202 drives the second capacitor plate 12 to rotate. The first capacitor plate 11 and the second capacitor plate 12 are both electrically connected with the capacitance meter 13, and the capacitance meter 13 measures the capacitance between the first capacitor plate 11 and the second capacitor plate 12; since the magnetic fluid has a different dielectric constant from air, and different quantities of magnetic fluid between the first capacitor plate 11 and the second capacitor plate 12 reflect different dielectric constants, the distribution state of the magnetic fluid in the sealing gap may be determined according to the capacitance between the first capacitor plate 11 and the second capacitor plate measured by the capacitance meter 13, so as to learn a sealing condition of the magnetic fluid and avoid a dangerous condition.

In some embodiments, an annular pole tooth 206 is provided at the inner circumferential surface of the pole piece 203, and the first capacitor plate 11 is provided at the annular pole tooth 206.

As shown in FIG. 2, the annular pole tooth 206 is provided at the inner circumferential surface of the pole piece 203, and has an upper side surface, a lower side surface, an inner circumferential surface and an outer circumferential surface, the upper side surface of the annular pole tooth 206 is parallel to the lower side surface thereof, the outer circumferential surface of the annular pole tooth 206 is connected with the inner circumferential surface of the pole piece 203, the first capacitor plate 11 is provided at the inner circumferential surface of the annular pole tooth 206, and a gap, i.e., the sealing gap 201, is formed between the inner circumferential surface of the annular pole tooth 206 and the outer circumferential surface of the rotating shaft 202. Preferably, the first capacitor plate 11 has a same height as the annular pole tooth 206 in the up-down direction.

In some embodiments, the sealing device 200 further includes a shaft sleeve 204, a first annular groove 2021 is provided at the outer circumferential surface of the rotating shaft 202, the shaft sleeve 204 is fitted in the first annular groove 2021, an outer circumferential surface of the shaft sleeve 204 is located outside the outer circumferential surface of the rotating shaft 202 in the radial direction of the rotating shaft 202, and the second capacitor plate 12 is provided at an outer circumference of the shaft sleeve 204.

As shown in FIGS. 1 and 2, the rotating shaft 202 is arranged vertically, and the first annular groove 2021 is formed at the outer circumferential surface of the rotating shaft 202. The shaft sleeve 204 is substantially cylindrical, fitted over the rotating shaft 202, mounted in the first annular groove 2021, and located on an inner side of the inner circumferential surface of the pole piece 203, and the second capacitor plate 12 is provided at the outer circumferential surface of the shaft sleeve 204. Thus, the shaft sleeve 204 avoids direct connection between the second capacitor plate 12 and the rotating shaft 202, such that the second capacitor plate 12 is more firmly connected during rotation.

In some embodiments, a second annular groove 2041 is formed at the outer circumferential surface of the shaft sleeve 204, and the second capacitor plate 12 is fitted in the second annular groove 2041.

As shown in FIGS. 1 and 2, the second annular groove 2041 is formed at the outer circumferential surface of the shaft sleeve 204, the second capacitor plate 12 is fitted over the outer circumferential surface of the shaft sleeve 204, and the second capacitor plate 12 is mounted in the second annular groove 2041. Specifically, an upper end of the second capacitor plate 12 has a same height as an upper end of the second annular groove 2041 in the up-down direction, and a lower end of the second capacitor plate 12 has a same height as a lower end of the second annular groove 2041 in the up-down direction.

In some embodiments, as shown in FIG. 2, the first capacitor plate 11 is welded to the inner circumferential surface of the annular pole tooth 206, and the second capacitor plate 12 is welded to the outer circumferential surface of the rotating shaft 202. Thus, the first capacitor plate 11 is more firmly connected with the annular pole tooth 206, and the second capacitor plate 12 is more firmly connected with the rotating shaft 202, thus guaranteeing the unchanged relative area between the first capacitor plate 11 and the second capacitor plate 12 during rotation of the rotating shaft 202.

In some embodiments, a plurality of first capacitor plates 11 and a plurality of second capacitor plates 12 are provided. The plurality of first capacitor plates 11 are arranged at intervals in the axial direction of the rotating shaft 202, and all electrically connected with the capacitance meter 13. The plurality of second capacitor plates 12 are arranged at intervals in the axial direction of the rotating shaft 202, and all electrically connected with the capacitance meter 13, and the plurality of first capacitor plates 11 and the plurality of second capacitor plates 12 are in one-to-one correspondence in the radial direction of the rotating shaft 202.

As shown in FIG. 2, a plurality of annular pole teeth 206 are provided at the inner circumferential surface of the pole piece 203, and arranged at intervals in the up-down direction, and the annular pole teeth 206, the first capacitor plates 11, and the second capacitor plates 12 have same numbers. The plurality of first capacitor plates 11 are correspondingly arranged at the plurality of annular pole teeth 206, and the plurality of second capacitor plates 12 are arranged opposite to the plurality of first capacitor plates 11.

In some embodiments, the detection system 100 for a distribution state of magnetic fluid in a sealing gap further includes a brush device 21 electrically connected with the capacitance meter 13, and a brush head (for example, the lower end portion of the brush device 21 in FIG. 1) of the brush device 21 abuts against an end surface of the rotating shaft 202.

As shown in FIG. 1, the brush device 21 is electrically connected with the capacitance meter 13, and provided above the rotating shaft 202, and the lower end portion of the brush device 21 abuts against an upper end surface of the rotating shaft 202. Further, during use, the brush device 21 is worn gradually, and accuracy of a measurement result of the capacitance meter may be improved by replacing the brush device 21.

A detection system 100 for a distribution state of magnetic fluid in a sealing gap according to some specific examples of the present disclosure will be described below with reference to FIGS. 1 to 2.

As shown in FIGS. 1 to 2, the detection system 100 for a distribution state of magnetic fluid in a sealing gap according to an embodiment of the present disclosure includes a detection assembly 1 and a brush device 21.

A sealing device 200 includes a rotating shaft 202, an annular pole tooth 206, a pole piece 203 and a shaft sleeve 204, and a plurality of conduits 205 are provided in the sealing device 200.

The rotating shaft 202 is arranged vertically, and a horizontally arranged first annular groove 2021 is formed at an outer circumferential surface of the rotating shaft 202. The shaft sleeve 204 is substantially cylindrical, fitted over the rotating shaft 202, and mounted in the first annular groove 2021, and a horizontally arranged second annular groove 2041 is formed at an outer circumferential surface of the shaft sleeve 204. The pole piece 203 is substantially cylindrical, a pole piece hole 2031 is formed in the pole piece 203, the rotating shaft 202 is inserted into the pole piece hole 2031, and the shaft sleeve 204 is located inside an inner circumferential surface of the pole piece 203 in an inside-outside direction.

A plurality of annular pole teeth 206 are provided at the inner circumferential surface of the pole piece 203, and arranged at intervals in an up-down direction, the annular pole tooth 206 has an upper side surface, a lower side surface, an inner circumferential surface and an outer circumferential surface, the upper side surface of the annular pole tooth 206 is parallel to the lower side surface thereof, the outer circumferential surface of the annular pole tooth 206 is connected with the inner circumferential surface of the pole piece 203, and a gap, i.e., the sealing gap 201, is formed between the inner circumferential surface of the annular pole tooth 206 and the outer circumferential surface of the shaft sleeve 204.

The detection assembly 1 includes a plurality of first capacitor plates 11, a plurality of second capacitor plates 12, a capacitance meter 13, and a plurality of electric wires 14.

The first capacitor plate 11 and the second capacitor plate 12 are both annular, and the first capacitor plate 11, the second capacitor plate 12 and the annular pole tooth 206 have same numbers. The first capacitor plate 11 is provided at the inner circumferential surface of the annular pole tooth 206, and the second capacitor plate 12 is provided in the second annular groove of the shaft sleeve 204.

One part of the electric wires 14 are arranged in the conduit 205, the plurality of first capacitor plates 11 are in communication with the capacitance meter 13 by the one part of the electric wires 14, and the brush device 21 is in communication with the capacitance meter 13 by the other part of the electric wires 14.

The brush devices 21 are provided above the rotating shaft 202, and a lower end of the brush device 21 abuts against an upper end surface of the rotating shaft 202.

As shown in FIGS. 1 to 2, a detection method for a distribution state of magnetic fluid in a sealing gap according to an embodiment of the present disclosure, the detection system 100 for a distribution state of magnetic fluid in a sealing gap according to the embodiment of the present disclosure being used to detect the distribution state of the magnetic fluid in the sealing gap, includes: starting a rotating shaft 202, and driving, by the rotating shaft 202, a second capacitor plate 12 to rotate; starting a capacitance meter 13, and recording capacitance between a first capacitor plate 11 and the second capacitor plate 12 as sealing capacitance; and determining a sealing state of the magnetic fluid in the sealing gap 201 according to the sealing capacitance.

As shown in FIGS. 1 and 2, a sealing device 200 includes the rotating shaft 202, an annular pole tooth 206, a pole piece 203 and a shaft sleeve 204, and a plurality of conduits 205 are provided in the sealing device 200. The shaft sleeve 204 is fitted over the rotating shaft 202, the pole piece 203 is fitted over the rotating shaft 202, and the shaft sleeve 204 has a same height as the pole piece 203 in an up-down direction, and located on an inner side of the pole piece 203 in an inside-outside direction.

A plurality of annular pole teeth 206 arranged at intervals in the up-down direction are provided at an inner circumferential surface of the pole piece 203, an outer circumferential surface of the annular pole tooth 206 is connected with the inner circumferential surface of the pole piece 203, and a gap, i.e., the sealing gap 201, is formed between an inner circumferential surface of the annular pole tooth 206 and an outer circumferential surface of the shaft sleeve 204.

The first capacitor plate 11 and the second capacitor plate 12 are both annular, the first capacitor plate 11 is provided at the inner circumferential surface of the annular pole tooth 206, the second capacitor plate 12 is provided at the outer circumferential surface of the shaft sleeve 204, the annular pole tooth 206, the first capacitor plate 11 and the second capacitor plate 12 have same heights in the up-down direction, and the first capacitor plate 11 and the second capacitor plate 12 are opposite to each other in the inside-outside direction.

One part of electric wires 14 are arranged in the conduit 205, the plurality of first capacitor plates 11 are in communication with the capacitance meter 13 by the one part of the electric wires 14, and the brush device 21 is in communication with the capacitance meter 13 by the other part of the electric wires 14.

In the detection method for a distribution state of magnetic fluid in a sealing gap according to the embodiment of the present disclosure, the first capacitor plate is provided at the inner circumferential surface of the pole piece in the sealing device, the second capacitor plate is provided at an outer circumferential surface of the rotating shaft in the sealing device, both the first capacitor plate and the second capacitor plate are annular, and the first capacitor plate and the second capacitor plate are opposite to each other in a radial direction of the rotating shaft, thus guaranteeing an unchanged relative area between the first capacitor plate and the second capacitor plate when the rotating shaft drives the second capacitor plate to rotate. The first capacitor plate and the second capacitor plate are both electrically connected with the capacitance meter, and the capacitance meter measures the capacitance between the first capacitor plate and the second capacitor plate. Since the magnetic fluid has a different dielectric constant from air, and different quantities of magnetic fluid between the first capacitor plate 11 and the second capacitor plate 12 reflect different dielectric constants, the distribution state of the magnetic fluid in the sealing gap 201 may be determined according to the capacitance between the first capacitor plate 11 and the second capacitor plate measured by the capacitance meter 13, so as to learn a sealing condition of the magnetic fluid and avoid a dangerous condition.

In some embodiments, before the step of starting a rotating shaft 202, and driving, by the rotating shaft 202, a second capacitor plate 12 to rotate, the detection method further includes: recording the capacitance between the first capacitor plate 11 and the second capacitor plate 12 as failure capacitance when the magnetic fluid is not injected into the sealing gap 201.

As shown in FIG. 1, when the magnetic fluid is not injected into the sealing gap 201, the capacitance meter 13 is turned on and records the capacitance between the first capacitor plate 11 and the second capacitor plate 12, and at this point, the capacitance between the first capacitor plate 11 and the second capacitor plate 12 is the failure capacitance, and air exists between the first capacitor plate 11 and the second capacitor plate 12.

In some embodiments, after the step of recording the capacitance between the first capacitor plate 11 and the second capacitor plate 12 as failure capacitance, the detection method further includes: recording the capacitance between the first capacitor plate 11 and the second capacitor plate 12 as working capacitance when the magnetic fluid is injected into the sealing gap 201 and the rotating shaft 202 does not rotate, the working capacitance being greater than the failure capacitance.

As shown in FIG. 1, when the magnetic fluid is injected into the sealing gap 201, but the rotating shaft 202 is still, a part between the first capacitor plate 11 and the second capacitor plate 12 is filled with the magnetic fluid, the capacitance meter 13 is turned on and records the capacitance between the first capacitor plate 11 and the second capacitor plate 12, and the capacitance between the first capacitor plate 11 and the second capacitor plate 12 is the working capacitance.

In some embodiments, after the step of recording the capacitance between the first capacitor plate 11 and the second capacitor plate 12 as working capacitance, the detection method further includes: starting the rotating shaft 202, driving, by the rotating shaft 202, the second capacitor plate 12 to rotate, and recording the capacitance between the first capacitor plate 11 and the second capacitor plate 12 as the sealing capacitance, the sealing capacitance changing between the working capacitance and the failure capacitance, and equivalence of the sealing capacitance and the failure capacitance indicating a seal failure.

As shown in FIG. 1, after the magnetic fluid is injected into the sealing gap 201, the rotating shaft 202 is started; at this point, the rotating shaft 202 drives the second capacitor plate 12 to rotate together around the axial direction of the rotating shaft 202, the magnetic fluid exists between the first capacitor plate 11 and the second capacitor plate 12, the capacitance meter 13 is turned on and records the capacitance between the first capacitor plate 11 and the second capacitor plate 12, and the capacitance between the first capacitor plate 11 and the second capacitor plate 12 is the sealing capacitance.

During rotation of the rotating shaft 202, the magnetic fluid gradually escapes, and the magnetic fluid of the first capacitor plate 11 and the second capacitor plate 12 gradually decreases, such that the first capacitor plate 11 and the second capacitor plate 12 have gradually decreased dielectric constants, thus reducing the sealing capacitance; equivalence of the sealing capacitance and the failure capacitance indicates that no magnetic fluid exists between the first capacitor plate 11 and the second capacitor plate 12.

In descriptions of the present disclosure, it should be understood that, directions or positional relationships indicated by terms "center", "longitudinal", "transverse", "length", "width", "thickness", "upper", "lower", "front", "rear", "left", "right", "vertical", "horizontal", "top", "bottom", "inner", "outer", "clockwise", "anticlockwise", "axial", "radial", "circumferential" etc. are based on orientations or positional relationships shown in the accompanying drawings, and they are used only for describing the present disclosure and for description simplicity, but do not indicate or imply that an indicated device or element must have a specific orientation or be constructed and operated in a specific orientation. Therefore, it cannot be understood as a limitation on the present disclosure.

In addition, the terms such as "first" and "second" are used herein for purposes of description and are not intended to indicate or imply relative importance or significance or to imply the number of indicated technical features. Thus, the feature associated with "first" and "second" may include at least one of this feature explicitly or implicitly. In the description of the present disclosure, "a plurality of" means at least two, for example, two, three, or the like, unless specifically limited otherwise.

In the present disclosure, unless specified or limited otherwise, the terms "mounted", "connected", "coupled", and "fixed" and the like are used broadly, and may be, for example, fixed connections, detachable connections, or integral connections; may also be mechanical or electrical connections or communication with each other; may also be direct connections or indirect connections via intervening structures; may also be communication or an interaction relationship of two elements. The above terms can be understood by those skilled in the art according to specific situations.

In the present disclosure, unless specified or limited otherwise, a structure in which a first feature is "on" or "below" a second feature may include an embodiment in which the first feature is in direct contact with the second feature, and may also include an embodiment in which the first feature and the second feature are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

In the present disclosure, terms "an embodiment", "some embodiments", "example", "specific example" or "some examples" means that a particular feature, structure, material, or characteristic described in connection with the embodiment or example is included in at least one embodiment or example of the present disclosure. In the specification, the schematic expressions to the above-mentioned terms are not necessarily referring to the same embodiment or example. Furthermore, the described particular features, structures, materials, or characteristics may be combined in any suitable manner in one or more embodiments or examples. Furthermore, those skilled in the art may combine different embodiments or examples and features in different embodiments or examples described in the specification, without mutual contradictions.

Although embodiments of the present disclosure have been shown and illustrated, it shall be understood that the above-mentioned embodiments are exemplary and not construed as limitations to the present disclosure. Various changes, modifications, alternatives and variants within the scope of the present disclosure may be made by those skilled in the art.

What is claimed is:

1. A detection system for a distribution state of magnetic fluid in a sealing gap, the sealing gap being formed in a sealing device, the sealing device comprising a rotating shaft and a pole piece fitted over the rotating shaft, a gap existing between an inner circumferential surface of the pole piece and an outer circumferential surface of the rotating shaft and in a radial direction of the rotating shaft, and the detection system comprising a detection assembly, wherein the detection assembly comprises:
   a first capacitor plate configured to be annular and arranged at the inner circumferential surface of the pole piece;
   a second capacitor plate configured to be annular and arranged at the outer circumferential surface of the rotating shaft and opposite to the first capacitor plate in the radial direction of the rotating shaft, the sealing gap being formed between the first capacitor plate and the second capacitor plate; and
   a capacitance meter electrically connected to both the first capacitor plate and the second capacitor plate being annular and configured to measure capacitance between the first capacitor plate and the second capacitor plate.

2. The detection system according to claim 1, wherein an annular pole tooth is arranged at the inner circumferential surface of the pole piece, and the first capacitor plate is arranged at an inner circumferential surface of the annular pole tooth.

3. The detection system according to claim 2, wherein the sealing device further comprises a shaft sleeve, a first annular groove is formed at the outer circumferential surface of the rotating shaft, the shaft sleeve is fitted in the first annular groove, an outer circumferential surface of the shaft sleeve is located outside the outer circumferential surface of the rotating shaft in the radial direction of the rotating shaft, and the second capacitor plate is arranged at an outer circumference of the shaft sleeve.

4. The detection system according to claim 3, wherein a second annular groove is formed at the outer circumferential surface of the shaft sleeve, and the second capacitor plate is fitted in the second annular groove.

5. The detection system according to claim 3, wherein the first capacitor plate is welded to the inner circumferential surface of the annular pole tooth, and the second capacitor plate is welded to the shaft sleeve.

6. The detection system according to claim 1, wherein a plurality of first capacitor plates are arranged at intervals in an axial direction of the rotating shaft and electrically connected with the capacitance meter; a plurality of second capacitor plates are arranged at intervals in the axial direction of the rotating shaft and electrically connected with the capacitance meter; and the plurality of first capacitor plates and the plurality of second capacitor plates are in one-to-one correspondence in the radial direction of the rotating shaft.

7. The detection system according to claim 6, further comprising: a brush device electrically connected with the capacitance meter, a brush head of the brush device abutting against an end surface of the rotating shaft.

8. A detection method for a distribution state of magnetic fluid in a sealing gap by using a detection system, the sealing gap being formed in a sealing device, the sealing device comprising a rotating shaft and a pole piece fitted over the rotating shaft, a gap existing between an inner circumferential surface of the pole piece and an outer circumferential surface of the rotating shaft and in a radial direction of the rotating shaft, and the detection system comprising a detection assembly, wherein the detection assembly comprises:
   a first capacitor plate configured to be annular and arranged at the inner circumferential surface of the pole piece;
   a second capacitor plate configured to be annular and arranged at the outer circumferential surface of the rotating shaft and opposite to the first capacitor plate in the radial direction of the rotating shaft, the sealing gap being formed between the first capacitor plate and the second capacitor plate; and
   a capacitance meter electrically connected to both the first capacitor plate and the second capacitor plate being annular and configured to measure capacitance between the first capacitor plate and the second capacitor plate;
   wherein the detection method comprises:
   starting the rotating shaft, and driving, by the rotating shaft, the second capacitor plate to rotate;
   starting the capacitance meter, and recording the capacitance between the first capacitor plate and the second capacitor plate as sealing capacitance; and
   determining a sealing state of the magnetic fluid in the sealing gap according to the sealing capacitance.

9. The detection method according to claim 8, before starting the rotating shaft, and driving, by the rotating shaft, the second capacitor plate to rotate, further comprising:

recording the capacitance between the first capacitor plate and the second capacitor plate as failure capacitance when the magnetic fluid is not injected into the sealing gap.

10. The detection method according to claim 9, after recording the capacitance between the first capacitor plate and the second capacitor plate as failure capacitance, further comprising:

recording the capacitance between the first capacitor plate and the second capacitor plate as working capacitance when the magnetic fluid is injected into the sealing gap and the rotating shaft is not rotating, wherein the working capacitance is greater than the failure capacitance.

11. The detection method according to claim 10, after recording the capacitance between the first capacitor plate and the second capacitor plate as working capacitance, further comprising:

starting the rotating shaft; and driving, by the rotating shaft, the second capacitor plate to rotate, and recording the capacitance between the first capacitor plate and the second capacitor plate as the sealing capacitance, wherein the sealing capacitance varies between the working capacitance and the failure capacitance, and equivalence of the sealing capacitance and the failure capacitance indicates a seal failure.

\* \* \* \* \*